US008289262B2

(12) United States Patent
Tsai et al.

(10) Patent No.: US 8,289,262 B2
(45) Date of Patent: Oct. 16, 2012

(54) LIQUID CRYSTAL DISPLAY AND SHIFT REGISTER DEVICE THEREOF

(75) Inventors: Tung-Chang Tsai, Miaoli County (TW); I-Chun Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 607 days.

(21) Appl. No.: 12/542,707

(22) Filed: Aug. 18, 2009

(65) Prior Publication Data

US 2011/0012823 A1   Jan. 20, 2011

(30) Foreign Application Priority Data

Jul. 14, 2009   (TW) .................................. 98123733 A (51) Int. Cl.
*G09G 3/36* (2006.01)
(52) U.S. Cl. .......................................... 345/100; 345/98
(58) Field of Classification Search ............ 345/87–100, 345/204–215
See application file for complete search history.

(56) References Cited

U.S. PATENT DOCUMENTS

| | | | |
|---|---|---|---|
| 5,764,206 A | 6/1998 | Koyama et al. | |
| 6,178,122 B1* | 1/2001 | Tomishima et al. | 365/189.11 |
| 6,327,195 B2* | 12/2001 | Tomishima et al. | 365/189.11 |
| 6,690,347 B2* | 2/2004 | Jeon et al. | 345/100 |
| 6,845,140 B2 | 1/2005 | Moon et al. | |
| 7,038,653 B2 | 5/2006 | Moon | |
| 7,289,096 B2* | 10/2007 | Jeon et al. | 345/100 |
| 2001/0000989 A1* | 5/2001 | Tomishima et al. | 365/189.11 |
| 2002/0149318 A1* | 10/2002 | Jeon et al. | 315/169.1 |
| 2004/0090412 A1* | 5/2004 | Jeon et al. | 345/100 |
| 2006/0050037 A1* | 3/2006 | Maki | 345/89 |
| 2006/0171501 A1* | 8/2006 | Lim | 377/64 |
| 2008/0158936 A1* | 7/2008 | Bertin et al. | 365/148 |
| 2009/0189677 A1* | 7/2009 | Lee et al. | 327/427 |

FOREIGN PATENT DOCUMENTS

CN   1725287   1/2006

OTHER PUBLICATIONS

Johns et al., "Analog integrated circuit design", John Wiley & Sons, Dec. 31, 1997, pp. 41-42.
"Second Office Action of China Counterpart Application", issued on Jul. 6, 2011, p. 1-p. 6.

* cited by examiner

*Primary Examiner* — Vijay Shankar
(74) *Attorney, Agent, or Firm* — Jianq Chyun IP Office (57) ABSTRACT

A liquid crystal display and a shift register device thereof are provided. The shift register device includes a plurality of shift registers connected in series. In the invention, the channel lengths of the transistors, which are responsible to stop outputting scan signal, in the shift register are manufactured greater than the channel lengths of the transistors, which are responsible to output the scan signal, in the shift register. As a result, the degree of influence that the leakage currents of the N-type transistors being responsible to stop outputting the scan signal in the shift register affect the transistors being responsible to output the scan signal when the transistors being responsible to stop outputting the scan signal are in the sub-threshold region is reduced. And thus each of the shift registers is able to output the scan signal normally.

20 Claims, 6 Drawing Sheets

LIQUID CRYSTAL DISPLAY AND SHIFT REGISTER DEVICE THEREOF

CROSS-REFERENCE TO RELATED APPLICATION

This application claims the priority benefit of Taiwan application serial no. 98123733, filed on Jul. 14, 2009. The entirety of the above-mentioned patent application is hereby incorporated by reference herein and made a part of specification.

BACKGROUND OF THE INVENTION

1. Field of the Invention

The invention relates to a flat panel display, and more particularly, to a liquid crystal display (LCD) and a shift register device thereof.

2. Description of Related Art

In recent years, with great advance in the semiconductor technique, portable electronic devices and flat panel displays (FDPs) have been rapidly developed. Among various types of FDP, liquid crystal displays (LCDs) have gradually become the mainstream display products due to the advantages such as a low operating voltage, free of harmful radiation, light weight and small and compact size. As a consequence, a fabricating method is developed towards miniature and low cost by manufacturers in this field. In order to lower down the fabricating cost of LCDs, instead of disposing shift registers of a scan driver IC on a scan side of an LCD, parts of manufacturers can directly dispose the shift registers of the scan driver IC on a glass substrate of the LCD under an amorphous silicon (a-Si) process. Hence, the scan driver IC originally disposed on the scan side of the LCD can be omitted such that the fabricating cost of the LCD is reduced.

In general, each of the shift registers directly disposed on the glass substrate of the LCD includes a plurality of N-type transistors. Parts of the N-type transistors are responsible to output scan signal during operation period of the shift register so as to turn on the corresponding pixel row in the LCD panel. And other N-type transistors are responsible to stop outputting the scan signal during non-operation period of shift registers.

However, in practice, the channel lengths of the N-type transistors responsible to output the scan signal and the channel lengths of the N-type transistors responsible to stop outputting the scan signal are the same. Hence, under this condition, the N-type transistors responsible to output the scan signal may not output the scan signal normally due to the leakage currents of the N-type transistors responsible to stop outputting the scan signal when the N-type transistors being responsible to stop outputting the scan signal are in the sub-threshold region. As a result, the shift register malfunctions and the LCD is not able to display a display image normally.

SUMMARY OF THE INVENTION

Accordingly, the invention provides a shift register device which includes a plurality of shift registers connected in series. An $i^{th}$ shift register of the plurality of shift registers includes a pre-charge unit, a pull-up unit and a pull-down unit, where i is positive integer. The pre-charge unit is configured to receive a first scan signal output by an $(i-1)^{th}$ shift register of the plurality of shift registers and output a charge signal according to the first scan signal. The pull-up unit is coupled to the pre-charge unit and configured to receive the charge signal and a first clock signal and output a second scan signal according to the charge signal and the first clock signal. The pull-down unit is coupled to the pre-charge unit and the pull-up unit. Besides, the pull-down unit is configured to receive a second clock signal and a third scan signal output by an $(i+1)^{th}$ shift register of the plurality of shift registers and determine whether pulling down the second scan signal to a reference voltage or not according to the second clock signal and the third scan signal.

In an exemplary embodiment of the invention, the pre-charge unit, the pull-up unit and the pull-down unit respectively have at least a transistor. In addition, the transistor in the pull-down unit has a first channel length; and the transistors in the pre-charge unit and the pull-up unit respectively have a second channel length. Besides, the first channel length is greater than the second channel length.

In an exemplary embodiment of the invention, the first channel length is substantially 1.01 to 4 times the second channel length.

The invention further provides a liquid crystal display (LCD) which includes an LCD panel and a backlight module. The backlight module is configured to provide a backlight source to the LCD panel. Furthermore, the LCD panel includes a substrate and the shift register device provided by the aforementioned invention. And the shift register device is directly disposed on the substrate of the LCD panel.

It should be noted that the above described general descriptions and following embodiments are only taken as examples and used for illustrating, not for limiting the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Descriptions of the invention are given with reference to the exemplary embodiments illustrated with accompanied drawings, wherein same or similar parts are denoted with same reference numerals.

Figure 1:
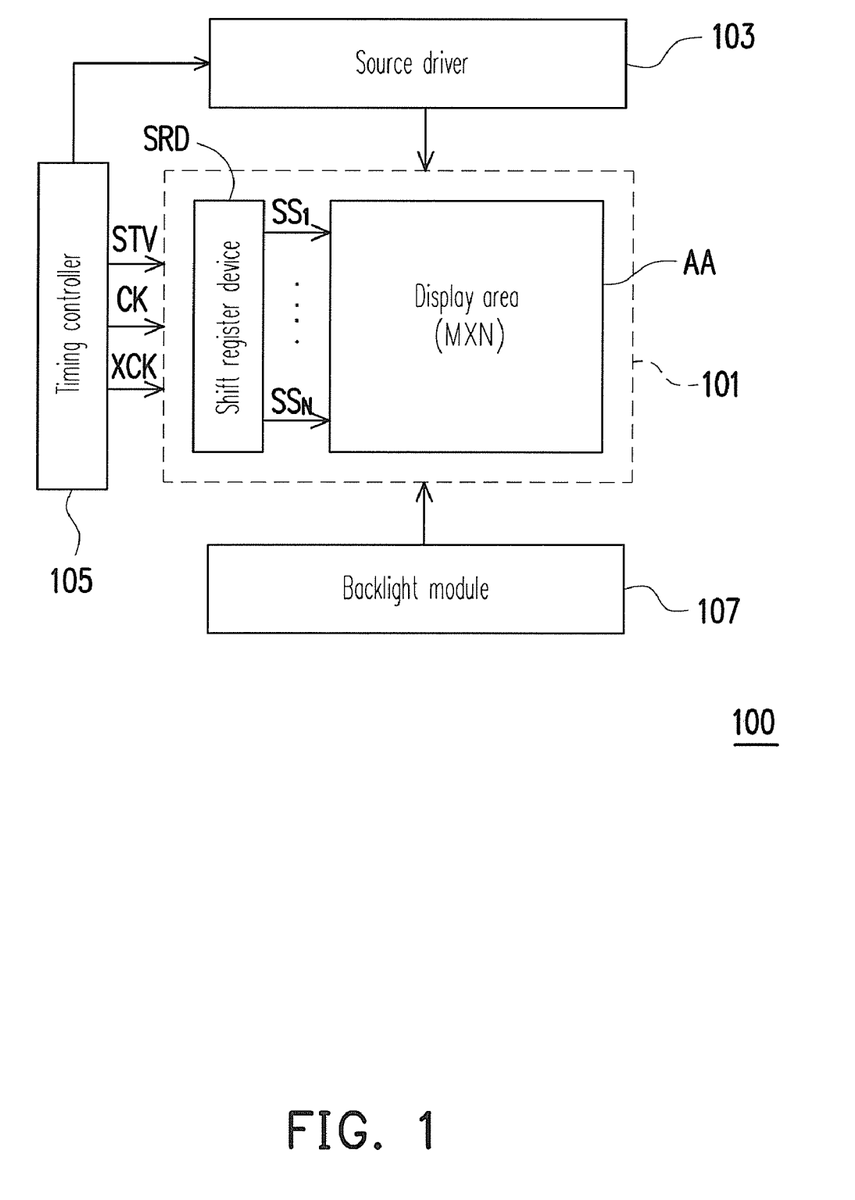
FIG. 1 is a block diagram illustrating a system of an LCD 100 according to an exemplary embodiment of the invention.

FIG. 1 is a block diagram illustrating a system of a liquid crystal display (LCD) 100 according to an exemplary embodiment of the invention. Referring to FIG. 1, the LCD 100 includes a display panel 101, a source driver 103, a timing controller 105 and a backlight module 107 configured to provide a backlight source required by the display panel 101. A display region AA of the display pane 101 has a plurality of pixels arranged in array, which is represented in M*N in FIG.

1 and both M, N are positive integers. Besides, a shift register device SRD is directly disposed on a side of a substrate (not shown, and for example, a glass substrate) of the display panel 101. The shift register device SRD is controlled by the timing controller 105, and configured to output scan signals $SS_1 \sim SS_N$ sequentially, such that the pixel rows in the display area AA are turned on one by one, i.e. from the first pixel row to the last pixel row in the display region AA.

Figure 2:
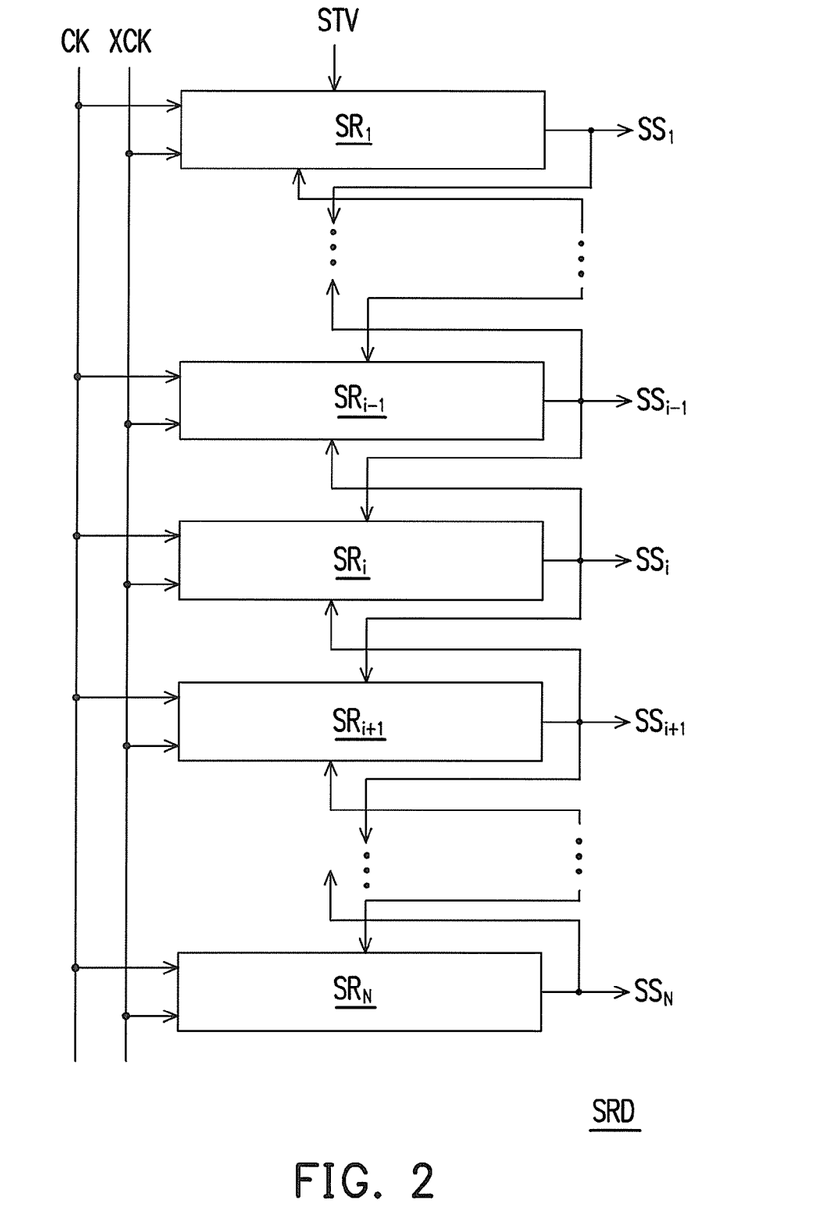
FIG. 2 is a block diagram of a shift register device SRD according to an exemplary embodiment of the invention.

In detail, FIG. 2 is a block diagram of a shift register device SRD according to an exemplary embodiment of the invention. Referring to FIG. 1 and FIG. 2, the shift register device SRD includes N shift registers $SR_1 \sim SR_N$ having substantially the same circuit configurations. And the shift registers $SR_1 \sim SR_N$ are connected in series. In the exemplary embodiment, since the circuit configurations and the operation of the shift registers $SR_1 \sim SR_N$ are substantially the same, only the $i^{th}$ shift register $SR_i$ is described as following.

Figure 3A:
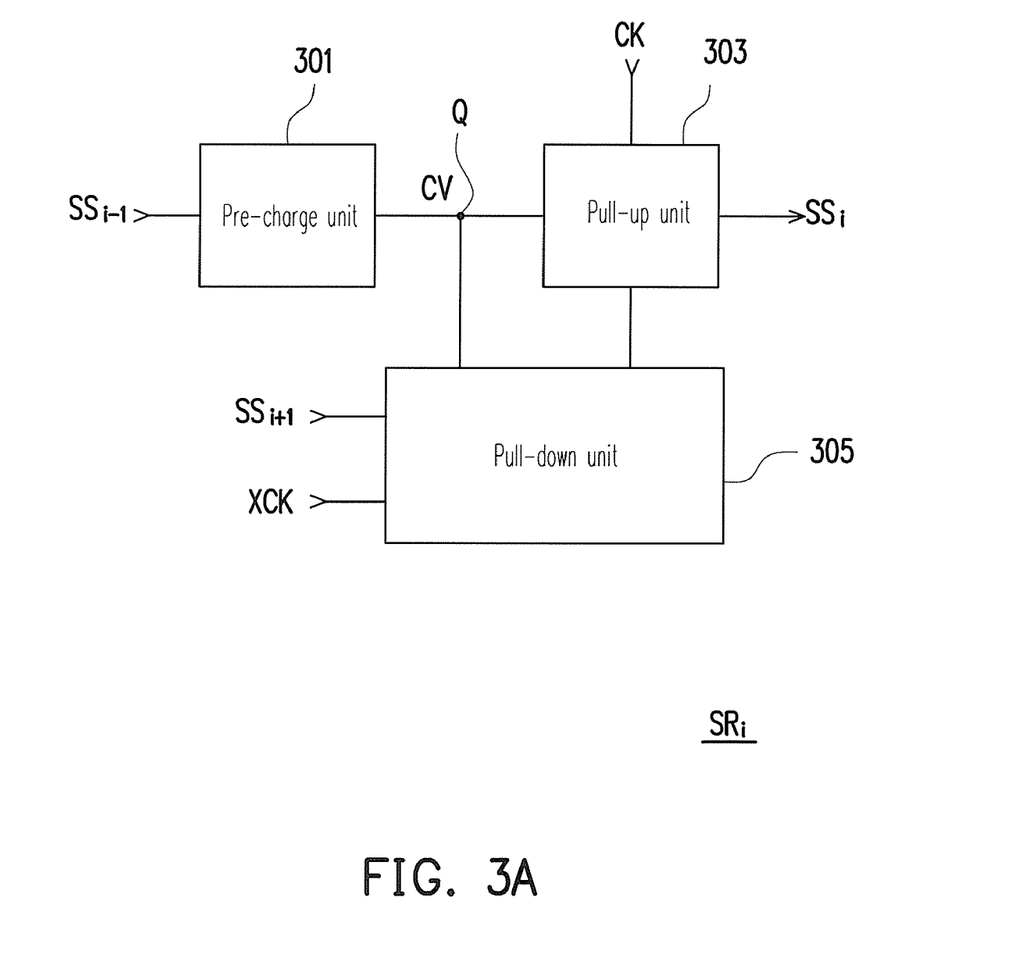
FIG. 3A is a block diagram of an $i^{th}$ shift register $SR_i$ according to an exemplary embodiment of the invention.
Figure 3B:
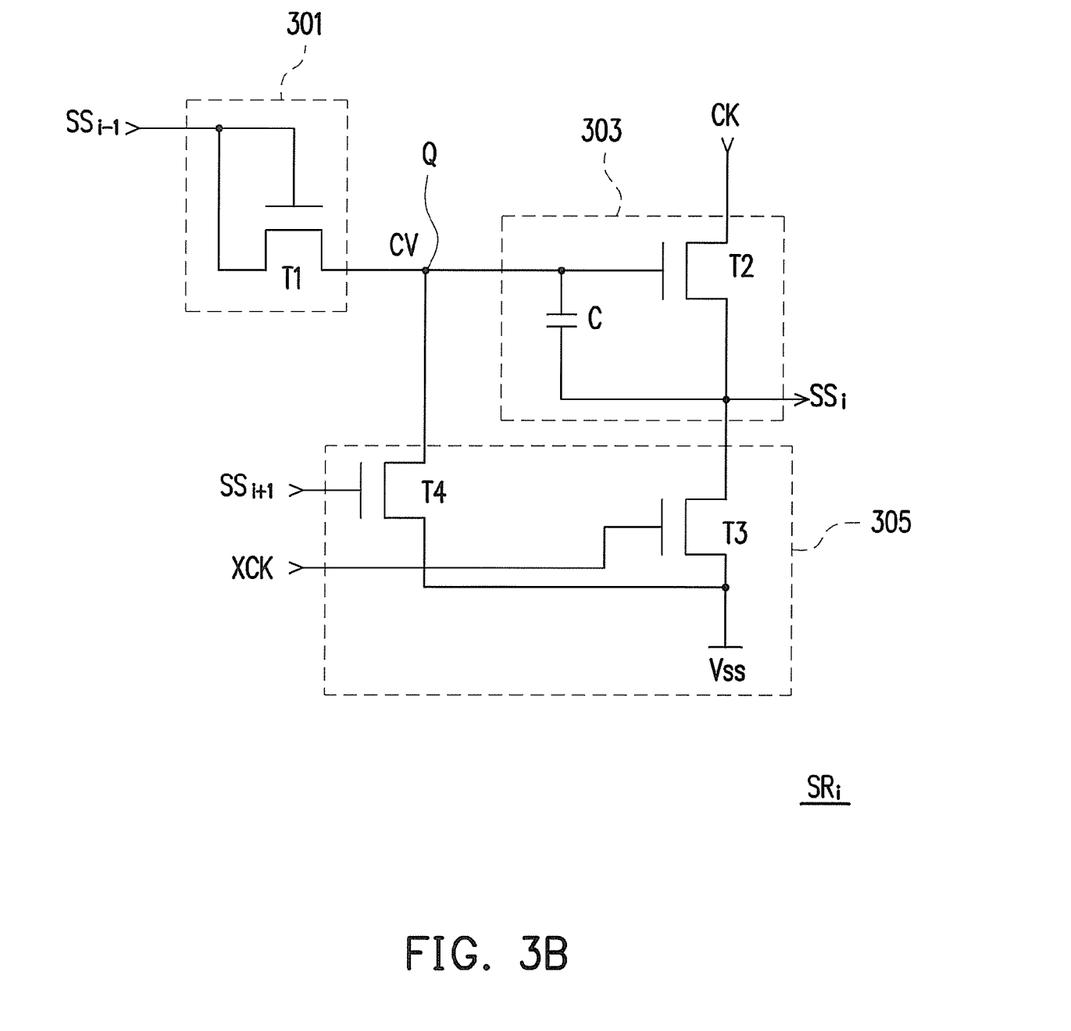
FIG. 3B is a circuit diagram of an $i^{th}$ shift register $SR_i$ according to an exemplary embodiment of the invention.

FIG. 3A is a block diagram of the $i^{th}$ shift register $SR_i$ according to an exemplary embodiment of the invention. FIG. 3B is a circuit diagram of the $i^{th}$ shift register $SR_i$ according to an exemplary embodiment of the invention. Referring FIG. 1 to FIG. 3B, the $i^{th}$ shift register includes a pre-charge unit 301, a pull-up unit 303 and a pull-down unit 305. The pre-charge unit 301 is configured to receive a scan signal $SS_{i-1}$ output by the $(i-1)^{th}$ shift register $SR_{i-1}$ and output a charge signal CV according to the scan signal $SS_{i-1}$. In the exemplary embodiment, except the pre-charge unit 301 of the $1^{st}$ shift register $SR_1$ receives an initial signal STV provided by the timing controller 105, the pre-charge unit 301 of rest of shift registers receives the scan signal output by the previous shift register.

For example, the pre-charge unit 301 of the $2^{nd}$ shift register $SR_2$ receives the scan signal $SS_1$ output by the $1^{st}$ shift register $SR_1$, and the pre-charge unit 301 of the $3^{rd}$ shift register $SR_3$ receives the scan signal $SS_2$ output by the $2^{nd}$ shift register $SR_2$, and so on, the pre-charge unit 301 of the $N^{th}$ shift register $SR_N$ receives the scan signal $SS_{N-1}$ output by the $(N-1)^{th}$ shift register $SR_{N-1}$.

Referring to FIG. 3A, the pull-up unit 303 is coupled to the pre-charge unit 301. And the pull-up unit 303 is configured to receive the charge signal CV output by the pre-charge unit 301 and a clock signal CK provided by the timing controller 105, and output the scan signal $SS_i$ according to the charge signal CV and the clock signal CK. The pull-down unit 305 is coupled to the pre-charge unit 301 and the pull-up unit 303. And the pull-down unit 305 is configured to receive a clock signal XCK provided by the timing controller 105 and the scan signal $SS_{i+1}$ output by the $(i+1)^{th}$ shift register $SR_{i+1}$. Then, the pull-down unit 305 determines whether pulling down the scan signal $SS_{i+1}$ to a reference voltage Vss according to the clock signal XCK and the scan signal $SS_{i+1}$. In addition, the reference voltage Vss is a ground voltage, but not limited thereto. Furthermore, the phase difference between the clock signals CK XCK provided by the timing controller 105 is 180-degree.

Referring to FIG. 3B, in the exemplary embodiment, the pre-charge unit 301 has an N-type transistor T1. A gate and a source of the N-type transistor T1 are connected with each other so as to receive the scan signal $SS_{i-1}$ output by the $(i-1)^{th}$ shift register $SR_{i-1}$, and a drain of the N-type transistor T1 is configured to output the charge signal CV.

Besides, the pull-up unit 303 has an N-type transistor T2 and a capacitor C. A gate of the N-type transistor T2 is connected with the drain of the N-type transistor T1, a source of the N-type transistor T2 is configured to receive the clock signal CK provided by the timing controller 105, and a drain of the N-type transistor T2 is configured to output the scan signal $SR_i$. The capacitor C is coupled between the gate and the drain of the N-type transistor T2.

Besides, the pull-down unit 305 has N-type transistors T3 and T4. A gate of the N-type transistor T3 is configured to receive the clock signal XCK provided by the timing controller 105. As shown in FIG. 3B, a source of the N-type transistor T3 is coupled to the drain of the N-type transistor T2, and a drain of the N-type transistor T3 is coupled to the reference voltage Vss. A gate of the N-type transistor T4 is configured to receive the scan signal $SS_{i+1}$ output by the $(i+1)^{th}$ shift register $SR_{i+1}$. A source of the N-type transistor T4 is coupled to the gate of the N-type transistor T2, and a drain of the N-type transistor T4 is coupled to the reference voltage Vss. In the exemplary embodiment, the N-type transistors T1 and T2 have the same channel length, and the N-type transistors T3 and T4 have the same channel lengths. But the channel length of the N-type transistors T3 and T4 is greater than the channel length of the N-type transistors T1 and T2.

Figure 4A:
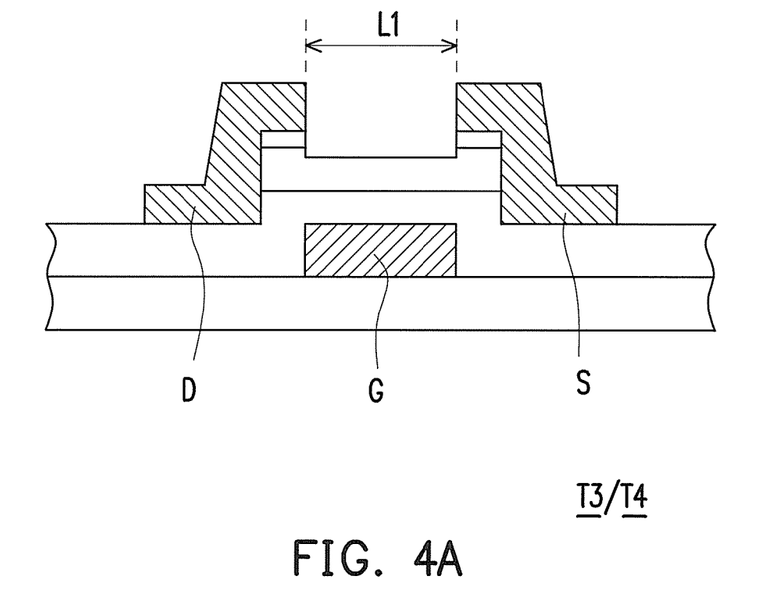
FIG. 4A is a schematic cross-sectional view of N-type transistors T3 and T4.
Figure 4B:
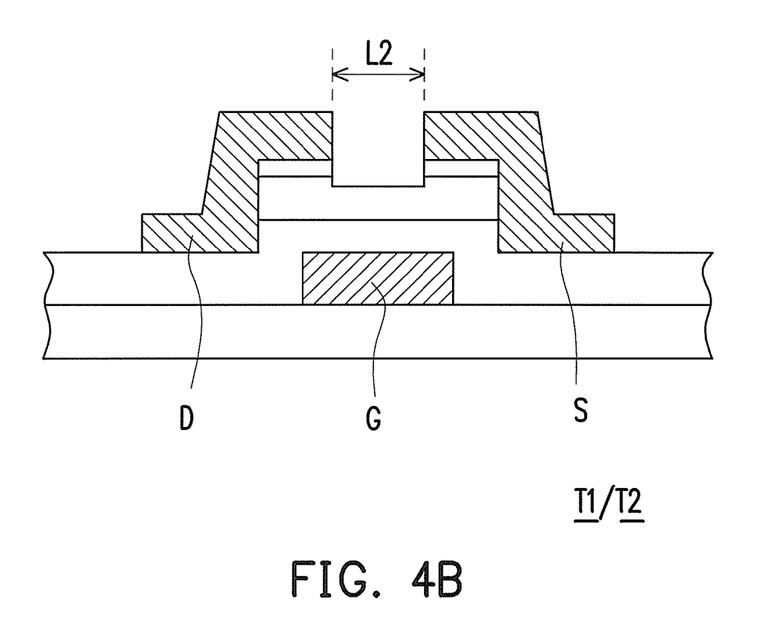
FIG. 4B is a schematic cross-sectional view of N-type transistors T1 and T2.

In detail, FIG. 4A is a schematic cross-sectional view of the N-type transistors T3 and T4, and FIG. 4B is a schematic cross-sectional view of the N-type transistors T1 and T2. Referring to FIG. 4A and FIG. 4B, it can be clearly seen that a reference number D represents the drain of the N-type transistors T1~T4, a reference number S represents the source of the N-type transistors T1~T4, and a reference number G represents the gate of the N-type transistors T1~T4. In addition, a reference number L1 represents the channel length of the N-type transistors T3 and T4, and a reference number L2 represents the channel length of the N-type transistors T1 and T2.

Herein, the so-called "channel length" means a distance between the drain and the gate of the N-type transistor. Preferably, the channel length L1 of the N-type transistors T3 and T4 is substantially 1.01 to 4 times the channel length L2 of the N-type transistor T1 and the N-type transistor T2, but not limited thereto. That is to say, a multiple of the channel length L1 of the N-type transistors T3 and T4 relative to the channel length L2 of the N-type transistors T1 and T2 varies depending on the design requirements. More details are to be followed hereunder.

Based on the above, when the pre-charge unit 301 of the $i^{th}$ shift register $SR_i$ receives the scan signal $SS_{i-1}$ output by the $(i-1)^{th}$ shift register $SR_{i-1}$, the N-type transistor T1 is turned on so as to pre-charge a node Q. Hence, when the clock signal CK provided by the timing controller 105 is enable, the voltage of the node Q is pulled up due to a coupling effect of the clock signal CK, such that the N-type transistor T2 of pull-up unit 303 is turned on. Then, the scan signal $SS_i$ is output to turn on the corresponding $i^{th}$ pixel row in the display region AA.

Next, after the pre-charge unit 301 and the pull-up unit 303 responsible to output the scan signal $SS_i$, the N-type transistor T3 of the pull-down unit 305 is turned on because the clock signal XCK provided by the timing controller 105 is enable. Hence, the scan signal $SS_i$ is pulled down to the reference voltage Vss such that the corresponding $i^{th}$ pixel row in the display region AA is turned off.

Besides, when the N-type transistor T3 of the pull-down unit 305 pulls down the scan signal $SS_i$ to the reference voltage Vss, the $SR_{i+1}$ output by the $(i+1)^{th}$ shift register is fed back to the N-type transistor T4 in the pull-down unit 305 of the $i^{th}$ shift register $SR_i$. As a result, the N-type transistor T4 in the pull-down unit 305 of the $i^{th}$ shift register $SR_i$ is turned on so as to discharge the node Q. And the coupling effect on the node Q between the pre-charge unit 301 and the pull-up unit 303 due to the clock signal CK is prevented after the scan signal $SS_i$ is output. Therefore, after the pre-charge unit 301 and the pull-up unit 303 responsible to output the scan signal $SS_i$, the pull-down unit 305 stops outputting the scan signal $SS_i$.

Accordingly, when the timing controller 105 provides the initial signal STV for the pre-charge unit 301 of the $1^{st}$ shift register $SR_1$, and respectively provides the clock signals CK and XCK for the pull-up unit 303 and the pull-down unit 305 of each of the shift registers $SR_1 \sim SR_N$, the shift registers $SR_1 \sim SR_N$ in the shift register device SRD sequentially output the scan signal $SR_1 \sim SR_N$, such that the pixel rows in the display area AA are turned on one by one, i.e. from the first pixel row to the last pixel row in the display region AA. Besides, the source driver 103 provides corresponding display data for the pixel row which is turned on by the shift register device SRD. Accordingly, together with the backlight source provided by the backlight module 107, the display panel 101 is able to display a display image.

According to the related art, the channel length of N-type transistors responsible to output the scan signal and the channel length of N-type transistors responsible to stop outputting the scan signal are the same. Hence, under this condition, the N-type transistor responsible to output the scan signal may not output the scan signal normally due to the leakage currents of the N-type transistors responsible to stop outputting the scan signal when the N-type transistors responsible to stop outputting the scan signal are in the sub-threshold region. As a result, the shift registers malfunction and the LCD is not able to display a display image normally.

As such, when the channel length of the N-type transistors T1~T4 in the shift registers $SR_1 \sim SR_N$ is the same (i.e. L1=L2), the N-type transistors T1 and T2 responsible to output the scan signals $SS_1 \sim SS_N$ may not output the scan signals $SS_1 \sim SS_N$ normally due to the leakage currents of the N-type transistors T3 and T4 responsible to stop outputting the scan signals $SS_1 \sim SS_N$ when the N-type transistors T3 and T4 responsible to stop outputting the scan signals $SS_1 \sim SS_N$ are in the sub-threshold region. As a result, the shift registers $SR_1 \sim SR_N$ malfunction and the LCD 100 is not able to display a display image normally.

Figure 5:
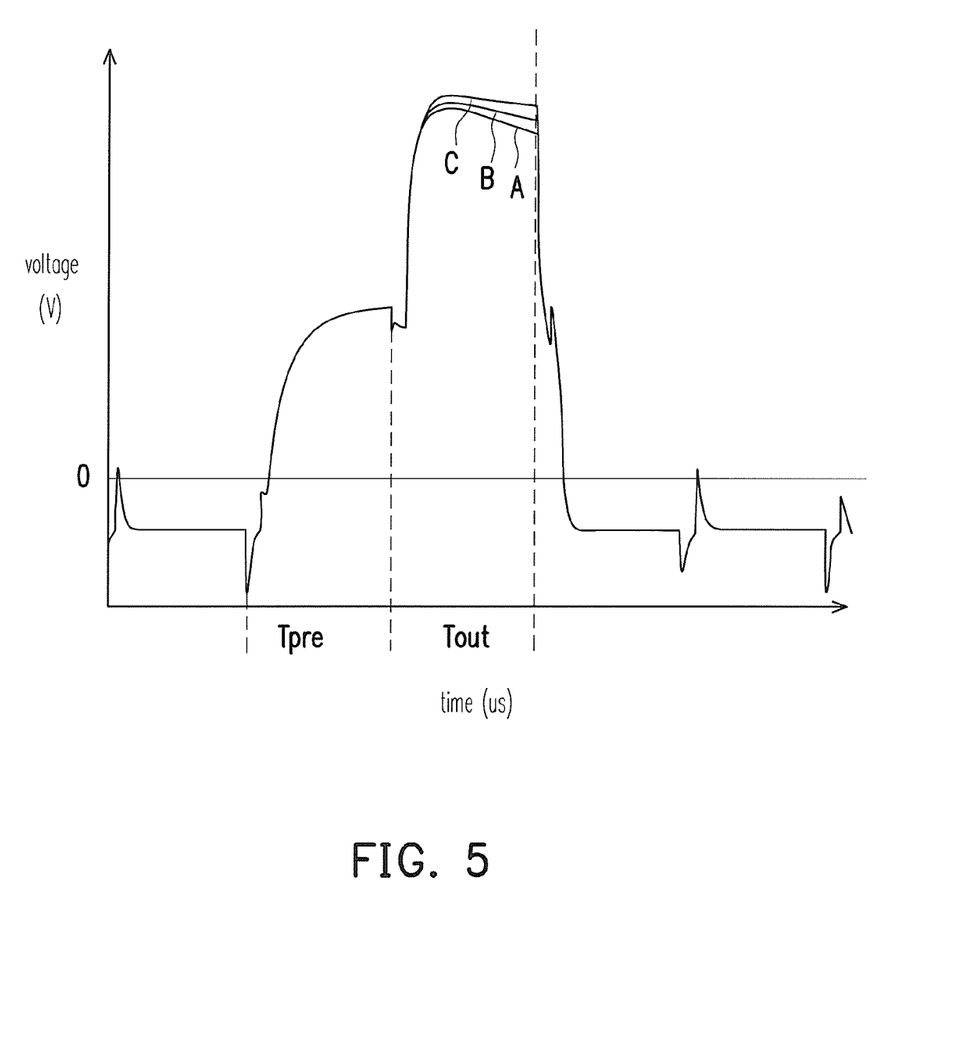
FIG. 5 is an experimental waveform of a node Q of an $i^{th}$ shift register $SR_i$ according to an exemplary embodiment of the invention.

Accordingly, the channel length L1 of the N-type transistors T3 and T4 in the pull-down unit 305 designed in the exemplary embodiment is greater than the channel length L2 of the N-type transistors T1 and T2 in the pull-up unit 303, i.e. L1>L2. And the channel length L1 of the N-type transistors T3 and T4 in the pull-down unit 305 is substantially 1.01 to 4 times the channel length L2 of the N-type transistors T1 and T2 in the pull-up unit 303. Specifically, FIG. 5 is an experimental waveform of the node Q of the $i^{th}$ shift register $SR_i$ according to an exemplary embodiment of the invention. Referring to FIG. 3 and FIG. 5, it can be clearly seen that the node Q is pre-charged during a period Tpre. As shown in FIG. 5, three curves A, B and C are respectively depicted within the period Tout. The curve A shows the degree of influence that the leakage currents of the N-type transistors T3 and T4 affect the N-type transistors T1 and T2 as the N-type transistors T3 and T4 are in the sub-threshold region when the channel length L1 of the N-type transistors T3 and T4 in the pull-down unit 305 is equal to the channel length L2 of the N-type transistors T1 and T2 in the pull-up unit 303 (i.e. L1=L2). The curve B shows the degree of influence that the leakage currents of the N-type transistors T3 and T4 affect the N-type transistors T1 and T2 as the N-type transistors T3 and T4 are in the sub-threshold region when the channel length L1 of the N-type transistors T3 and T4 in the pull-down unit 305 is slightly greater than the channel length L2 of the N-type transistors T1 and T2 in the pull-up unit 303 (i.e. L1>L2), such as L1=1.1 L2. The curve C shows the degree of influence that the leakage currents of the N-type transistors T3 and T4 affect the N-type transistors T1 and T2 as the N-type transistors T3 and T4 are in the sub-threshold region when the channel length L1 of the N-type transistors T3 and T4 in the pull-down unit 305 is far greater than the channel length L2 of the N-type transistors T1 and T2 in the pull-up unit 303 (i.e. L1>>L2), such as L1=4 L2. Based on the above, when the channel length L1 of the N-type transistors T3 and T4 in the pull-down unit 305 is equal to the channel length L2 of the N-type transistors T1 and T2 in the pull-up unit 303, the degree of influence that the leakage currents of the N-type transistors T3 and T4 affect the N-type transistors T1 and T2 as the N-type transistors T3 and T4 are in the sub-threshold region is more serious. That is, the voltage drop of the curve A is greatest during a period Tout. Hence, the $i^{th}$ shift register $SR_i$ may not output the scan signal $SS_i$ normally.

In addition, the more the length difference between channel lengths L1 of the N-type transistors T3 and T4 in the pull-down unit 305 and channel lengths L2 of the N-type transistors T1 and T2 in the pull-up unit 303, the less the degree of influence that the leakage currents of the N-type transistors T3 and T4 affect the N-type transistors T1 and T2 as the N-type transistors T3 and T4 are in the sub-threshold region. That is, the voltage drop of the curves B and C during the period Tout is gradually reduced relative to that of the curve A. As a result, the $i^{th}$ shift register $SR_i$ is ensured being able to output the scan signal $SS_i$ normally.

In summary, since the channel length of the N-type transistors responsible to output the scan signal in the shift register device of the invention is greater than the channel length of the N-type transistors responsible to stop outputting the scan signal, the degree of influence that the leakage currents of the N-type transistors responsible to stop outputting the scan signal affect the N-type transistor responsible to output the scan signal is reduced when the N-type transistors responsible to stop outputting the scan signal are in the sub-threshold region. Hence, the shift register is ensured being able to output the scan signal normally.

In addition, although a certain circuit implementation form of the pre-charge unit, the pull-up unit and the pull-down unit is provided in the above-mentioned exemplary embodiment, but the invention is not limited thereto. That is to say, as long as the shift register is capable of being divided into other circuit implementation form of the pre-charge unit, the pull-up unit and the pull-down unit, the channel lengths of all or parts of the N-type transistors in the pull-down unit are able to be increased according to the invention. As a result, the degree of influence that the leakage currents of the N-type transistors responsible to stop outputting the scan signal in the shift register affect the N-type transistors responsible to output the scan signal when the N-type transistors responsible to stop outputting the scan signal are in the sub-threshold region is reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A liquid crystal display (LCD) comprising:
an LCD panel comprising a substrate and a shift register device, the shift register device being directly disposed on the substrate and has a plurality of shift registers connected in series for sequentially driving a plurality of pixel-rows of the LCD panel, an $i^{th}$ shift register of the plurality of shift registers comprising:
- a pre-charge unit receiving a first scan signal output by an $(i-1)^{th}$ shift register of the plurality of shift registers, and outputting a charge signal according to the first scan signal, where i is a positive integer;
- a pull-up unit coupled to the pre-charge unit, receiving the charge signal and a first clock signal, and outputting a second scan signal according to the charge signal and the first clock signal; and
- a pull-down unit coupled to the pre-charge unit and the pull-up unit, receiving a second clock signal and a third scan signal output by an $(i+1)^{th}$ shift register of the plurality of shift registers, and determining whether pulling down the second scan signal to a reference voltage according to the second clock signal and the third scan signal,
- wherein the pre-charge unit, the pull-up unit and the pull-down unit respectively have at least a transistor, the transistor in the pull-down unit has a first channel length, the transistors in the pre-charge unit and the pull-up unit respectively have a second channel length, the first channel length is greater than the second channel length, and first channel length is substantially 1.01 to 4 times the second channel length; and
- a backlight module providing a backlight source to the LCD panel.

2. The LCD of claim 1, wherein the transistor in the pre-charge unit is a first N-type transistor,
- wherein a gate and a source of the first N-type transistor are connected with each other to receive the first scan signal, and a drain of the first N-type transistor is configured to output the charge signal.

3. The LCD of claim 2, wherein the transistor in the pull-up unit is a second N-type transistor,
- wherein a gate of the second N-type transistor is connected with the drain of the first N-type transistor, a source of the second N-type transistor is configured to receive the first clock signal, and a drain of the second N-type transistor is configured to output the second scan signal.

4. The LCD of claim 3, wherein the pull-up unit further has a capacitor coupled between the gate and the drain of the second N-type transistor.

5. The LCD of claim 3, wherein the transistor in the pull-down unit is a third N-type transistor,
- wherein a gate of the third N-type transistor is configured to receive the second clock signal, a source of the third N-type transistor is coupled to the drain of the second N-type transistor, and a drain of the third N-type transistor is coupled to the reference voltage.

6. The LCD of claim 5, wherein the pull-down unit further has another transistor which is a fourth N-type transistor,
- wherein a gate of the fourth N-type transistor is configured to receive the third scan signal, a source of the fourth N-type transistor is coupled to the gate of the second N-type transistor, and a drain of the fourth N-type transistor is coupled to the reference voltage.

7. The LCD of claim 6, wherein the first N-type transistor and the second N-type transistor respectively have the second channel length, and the third N-type transistor and the fourth N-type transistor respectively have the first channel length.

8. The LCD of claim 7, wherein the first channel length of the third N-type transistor and the fourth N-type transistor is greater than the second channel length of the first N-type transistor and the N-type second transistor.

9. The LCD of claim 8, wherein the first channel length of the third N-type transistor and the fourth N-type transistor is substantially 1.01 to 4 times the second channel length of the first N-type transistor and the N-type second transistor.

10. The LCD of claim 1, wherein a phase difference between the first clock signal and the second clock signal is 180-degree.

11. A shift register device for a display panel having a plurality of pixel-rows, the shift register device comprising:
- a plurality of shift registers connected in series and configured to sequentially drive the plurality of pixel-rows of the display panel, an $i^{th}$ shift register of the plurality of shift registers comprising:
  - a pre-charge unit receiving a first scan signal output by an $(i-1)^{th}$ shift register of the plurality of shift registers, and outputting a charge signal according to the first scan signal, where i is a positive integer;
  - a pull-up unit coupled to the pre-charge unit, receiving the charge signal and a first clock signal, and outputting a second scan signal according to the charge signal and the first clock signal; and
  - a pull-down unit coupled to the pre-charge unit and the pull-up unit, receiving a second clock signal and a third scan signal output by an $(i+1)^{th}$ shift register of the plurality of shift registers, and determining whether pulling down the second scan signal to a reference voltage according to the second clock signal and the third scan signal,
- wherein the pre-charge unit, the pull-up unit and the pull-down unit respectively have at least a transistor, the transistor in the pull-down unit has a first channel length, the transistors in the pre-charge unit and the pull-up unit respectively have a second channel length, the first channel length is greater than the second channel length, and the first channel length is substantially 1.01 to 4 times the second channel length.

12. The shift register device of claim 11, wherein the transistor in the pre-charge unit is a first N-type transistor,
- wherein, a gate and a source of the first N-type transistor are connected with each other to receive the first scan signal, and a drain of the first N-type transistor is configured to output the charge signal.

13. The shift register device of claim 12, wherein the transistor in the pull-up unit is a second N-type transistor,
- wherein a gate of the second N-type transistor is connected with the drain of the first N-type transistor, a source of the second N-type transistor is configured to receive the first clock signal, and a drain of the second N-type transistor is configured to output the second scan signal.

14. The shift register device of claim 13, wherein the pull-up unit further has a capacitor coupled between the gate and the drain of the second N-type transistor.

15. The shift register device of claim 13, wherein the transistor in the pull-down unit is a third N-type transistor,
- wherein a gate of the third N-type transistor is configured to receive the second clock signal, a source of the third N-type transistor is coupled to the drain of the second N-type transistor, and a drain of the third N-type transistor is coupled to the reference voltage.

16. The shift register device of claim 15, wherein the pull-down unit further has another transistor which is a fourth N-type transistor,
- wherein a gate of the fourth N-type transistor is configured to receive the third scan signal, a source of the fourth N-type transistor is coupled to the gate of the second N-type transistor, and a drain of the fourth N-type transistor is coupled to the reference voltage.

17. The shift register device of claim 16, wherein the first N-type transistor and the second N-type transistor respectively have the second channel length, and the third N-type transistor and the fourth N-type transistor respectively have the first channel length.

18. The shift register device of claim 17, wherein the first channel length of the third N-type transistor and the fourth N-type transistor is greater than the second channel length of the first N-type transistor and the second N-type transistor.

19. The shift register device of claim 18, wherein the first channel length of the third N-type transistor and the fourth N-type transistor is substantially 1.01 to 4 times the second channel length of the first N-type transistor and the second N-type transistor.

20. The shift register device of claim 19, wherein a phase difference between the first clock signal and the second clock signal is 180-degree.

* * * * *